United States Patent
Srinivas et al.

(10) Patent No.: US 12,512,849 B1
(45) Date of Patent: Dec. 30, 2025

(54) DIRECT DIGITAL SYNTHESIS CIRCUIT WITH MULTIPLE DIGITAL TO ANALOG CONVERTERS AND MULTI-MODE MIXER

(71) Applicant: BAE Systems Information and Electronic Systems Integration Inc., Nashua, NH (US)

(72) Inventors: Shailendra Srinivas, Nashua, NH (US); Steven E. Turner, Nashua, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 57 days.

(21) Appl. No.: 18/760,555

(22) Filed: Jul. 1, 2024

(51) Int. Cl.
 *H03M 1/74* (2006.01)
 *H03M 1/66* (2006.01)

(52) U.S. Cl.
 CPC ............. *H03M 1/74* (2013.01); *H03M 1/662* (2013.01)

(58) Field of Classification Search
 CPC .............................. H03M 1/74; H03M 1/662
 USPC .................................................. 341/126, 144
 See application file for complete search history.

(56) References Cited

U.S. PATENT DOCUMENTS

| | | | |
|---|---|---|---|
| 5,128,623 A | 7/1992 | Gilmore | |
| 6,930,627 B1 | 8/2005 | Hopkins | |
| 7,085,452 B1 | 8/2006 | Lin et al. | |
| 7,221,300 B2 * | 5/2007 | Fontaine | H03M 1/662 |
| | | | 341/142 |
| 7,283,707 B1 | 10/2007 | Maleki et al. | |
| 7,532,790 B2 | 5/2009 | Smith et al. | |
| 7,599,676 B2 | 10/2009 | Maxim | |
| 7,599,977 B2 | 10/2009 | Ammar | |
| 7,773,968 B2 | 8/2010 | Maxim et al. | |
| 7,796,971 B2 | 9/2010 | Li et al. | |
| 7,903,906 B2 | 3/2011 | Smith et al. | |

(Continued)

FOREIGN PATENT DOCUMENTS

| CN | 114488049 A | 5/2022 |
|---|---|---|
| CN | 113824488 B | 7/2022 |

(Continued)

OTHER PUBLICATIONS

International Search Report, PCT/US25/34082, mailed Aug. 20, 2025, 10 pages.

(Continued)

*Primary Examiner* — Khai M Nguyen
(74) *Attorney, Agent, or Firm* — Scott J. Asmus

(57) ABSTRACT

A direct digital synthesis (DDS) device includes a first digital to analog converter (DAC) and a second DAC, wherein the first and second DACs are configured to respectively process first and second samples of a digital amplitude signal. The DDS device also includes a switch configured to receive first and second DAC output signals from the first and second DACs, respectively, and selectively switch among at least the first DAC output signal and the second DAC output signal to generate a combined signal. The DDS device also includes a signal mixer configured to receive the combined signal and a mixer clock signal, wherein the signal mixer is a multi-mode mixer further configured to operate in (i) a pass-through mode where the combined signal is provided as a mixed signal, and (ii) a mixing mode where the combined signal is mixed with the mixer clock signal, to generate the mixed signal.

20 Claims, 9 Drawing Sheets

(56) References Cited

U.S. PATENT DOCUMENTS

| | | |
|---|---|---|
| 7,991,025 B2 | 8/2011 | Maleki et al. |
| 8,115,519 B2 | 2/2012 | Turner |
| 8,159,736 B2 | 4/2012 | Maleki et al. |
| 8,285,091 B2 | 10/2012 | Bravo-Abad et al. |
| 8,417,076 B2 | 4/2013 | Maleki et al. |
| 8,699,985 B1 | 4/2014 | Mar |
| 9,088,298 B2 | 7/2015 | Wloczysiak |
| 9,246,302 B2 | 1/2016 | Wilkinson et al. |
| 9,348,194 B2 | 5/2016 | Herr et al. |
| 9,435,961 B2 | 9/2016 | Jiang |
| 9,453,969 B2 | 9/2016 | Kobyakov et al. |
| 9,529,154 B2 | 12/2016 | Van Steenberge et al. |
| 9,906,236 B2 | 2/2018 | Lye et al. |
| 9,933,566 B2 | 4/2018 | Patel et al. |
| 10,148,275 B1 | 12/2018 | Pi |
| 10,270,529 B2 | 4/2019 | Karpov et al. |
| 10,326,468 B2 | 6/2019 | Lye et al. |
| 10,461,764 B1 | 10/2019 | Paro Filho et al. |
| 10,509,165 B2 | 12/2019 | Celo et al. |
| 10,663,572 B2 | 5/2020 | Mehdizad Taleie et al. |
| 10,778,263 B2 * | 9/2020 | Patel ................ H04B 1/04 |
| 10,958,279 B1 | 3/2021 | Bhatta et al. |
| 10,996,401 B2 | 5/2021 | Mentovich et al. |
| 11,016,363 B2 | 5/2021 | Lin et al. |
| 11,079,542 B2 | 8/2021 | Fertig et al. |
| 11,092,748 B2 | 8/2021 | Wang et al. |
| 11,303,287 B1 | 4/2022 | Turner et al. |
| 11,513,419 B2 | 11/2022 | Kippenberg et al. |
| 11,600,968 B2 | 3/2023 | Cheng et al. |
| 11,658,461 B1 | 5/2023 | Liu et al. |
| 2005/0025409 A1 | 2/2005 | Welch et al. |
| 2006/0176965 A1 | 8/2006 | Furman et al. |
| 2008/0180579 A1 | 7/2008 | Maxim |
| 2008/0181340 A1 | 7/2008 | Maxim |
| 2008/0285606 A1 | 11/2008 | Kippenberg et al. |
| 2009/0142018 A1 | 6/2009 | Gomyo et al. |
| 2010/0309039 A1 | 12/2010 | Rivers et al. |
| 2011/0043710 A1 | 2/2011 | Samarasooriya et al. |
| 2018/0076835 A1 | 3/2018 | Ray et al. |
| 2020/0313389 A1 | 10/2020 | Bilenko et al. |
| 2022/0131506 A1 | 4/2022 | Venkitasubramani et al. |
| 2022/0200576 A1 | 6/2022 | Zhan et al. |
| 2022/0209805 A1 | 6/2022 | Yu et al. |
| 2022/0407524 A1 | 12/2022 | Srinivas et al. |
| 2024/0280622 A1 | 8/2024 | Burkley et al. |

FOREIGN PATENT DOCUMENTS

| | | |
|---|---|---|
| EP | 3982192 A1 | 4/2022 |
| EP | 3997791 B1 | 4/2024 |
| WO | 02/25807 A3 | 3/2002 |
| WO | WO2005092050 A2 | 10/2005 |
| WO | WO2016062998 A1 | 4/2016 |
| WO | WO2016066998 A1 | 5/2016 |
| WO | WO2016205330 A1 | 12/2016 |
| WO | WO2018002675 A1 | 1/2018 |
| WO | WO2020210461 A1 | 10/2020 |
| WO | WO2021257561 A1 | 12/2021 |
| WO | WO2022125798 A1 | 6/2022 |
| WO | WO2022197507 A1 | 9/2022 |
| WO | WO2022266760 A1 | 12/2022 |
| WO | WO2023016962 A1 | 2/2023 |
| WO | WO2023113939 A1 | 6/2023 |
| WO | WO2023184014 A1 | 10/2023 |
| WO | WO2024205573 A1 | 10/2024 |

OTHER PUBLICATIONS

Sun, et al., "Integrated optical frequency division for microwave and mmWave generation," Nature, https://www.nature.com/articles/s41586-024-07057-0 (Mar. 6, 2024). 7 pages.

Kudelin, et al., "Photonic chip-based low-noise microwave oscillator," Nature, https://www.nature.com/articles/s41586-024-07058-z (Mar. 6, 2024). 13 pages.

Advanced Dynamic Signal Analysis, pp. 1-34, Crystal Instruments. Web. Jul. 20, 2016; [retrieved Jul. 31, 2023]. Retrieved from the Internet: <URL: http://www.crystalinstruments.com/dynamic-signal-analysis-advanced/>.

Li, et al., "Enhanced Microwave Electric Field Measurement With Cavity-Assisted Rydberg Electromagnetically Induced Transparency," Frontiers in Physics, vol. 10, Article 846687 (Feb. 24, 2022). 6 pages.

Chen, et al., "High finesse bow-tie Cavity for strong atom-photon coupling in rydberg arrays," Optics Express, vol. 30, No. 21, (Oct. 10, 2022,) 10 pages.

Prajapati, et al., "Sensitivity Comparison of Two-Photon vs Three-Photon Rydberg Electrometry," arXiv:2211.11848v2, [physics.atom-ph] (Nov. 23, 2022). 9 pages.

"Agile Laser", retrieved from the Internet at: https://www.qvideaslab.ca/research-home/agile-laser/ on Jun. 25, 2024. 7 pages.

"200kHz Swept Light Source", NTT Advanced Technology Corporation, 2 pages.

Kobayashi, et al., "200-KHz Swept Light Source Using a KTN Deflector and a High-speed Optical Coherence Tomography System," NTT Technical Review, vol. 12 No. 4 (Apr. 2014). 5 pages.

"FP4209 Insta Tune-Fast Random-Access Tunable Laser", (Product Brief), Freedom Photonics. 2 pages.

Nikolay G. Pavlov et al. Ultra-compact and ultra high-Q photonic chip based optical reference cavity at 1550nm, Laser Congress 2021.

M. Anderson et al. Highly efficient coupling of crystalline microresonators to integrated photonic waveguides, Optics Letters, May 1, 2018, vol. 43, No. 9.

Lefeng Zhou et al., Computer-controlled microresonator soliton comb system automating soliton generation and expanding excursion bandwidth, Optics Continuum, Feb. 15, 2022, vol. 1, No. 2.

Vanguard Automation, Photonic Wire Bonding, https://www.vanguard-automation.com/photonic-wire-bonding-2/ retrieved Jan. 25, 2024.

* cited by examiner

DIRECT DIGITAL SYNTHESIS CIRCUIT WITH MULTIPLE DIGITAL TO ANALOG CONVERTERS AND MULTI-MODE MIXER

STATEMENT OF GOVERNMENT INTEREST

This invention was made with United States Government assistance under Contract No. HR001122C0039. The United States Government has certain rights in this invention.

BACKGROUND

A signal having a target frequency can be generated using, for example, a phase locked loop (PLL) or a direct digital synthesizer (DDS). Typically, a PLL multiplies an input frequency by a multiple P (e.g., where P≥1), to generate an output signal having an output frequency. However, switching the output frequency in a PLL can be relatively slow. Also, noise in the input signal of a PLL is multiplied as a function of the multiple P and manifests in the output signal. In contrast to a PLL, a DDS divides an input frequency by a divisor Q (e.g., where Q≥2), to generate an output signal having an output frequency. Switching the output frequency of a DDS (e.g., frequency hopping) can be relatively fast. Also, noise in the output of the DDS is usually limited by sample clock phase noise and reconstruction noise attributable to the digital to analog converter (DAC) of the DDS. DDSs are used in many different applications, including applications in which fast frequency hopping is desired.

Figure 1A:
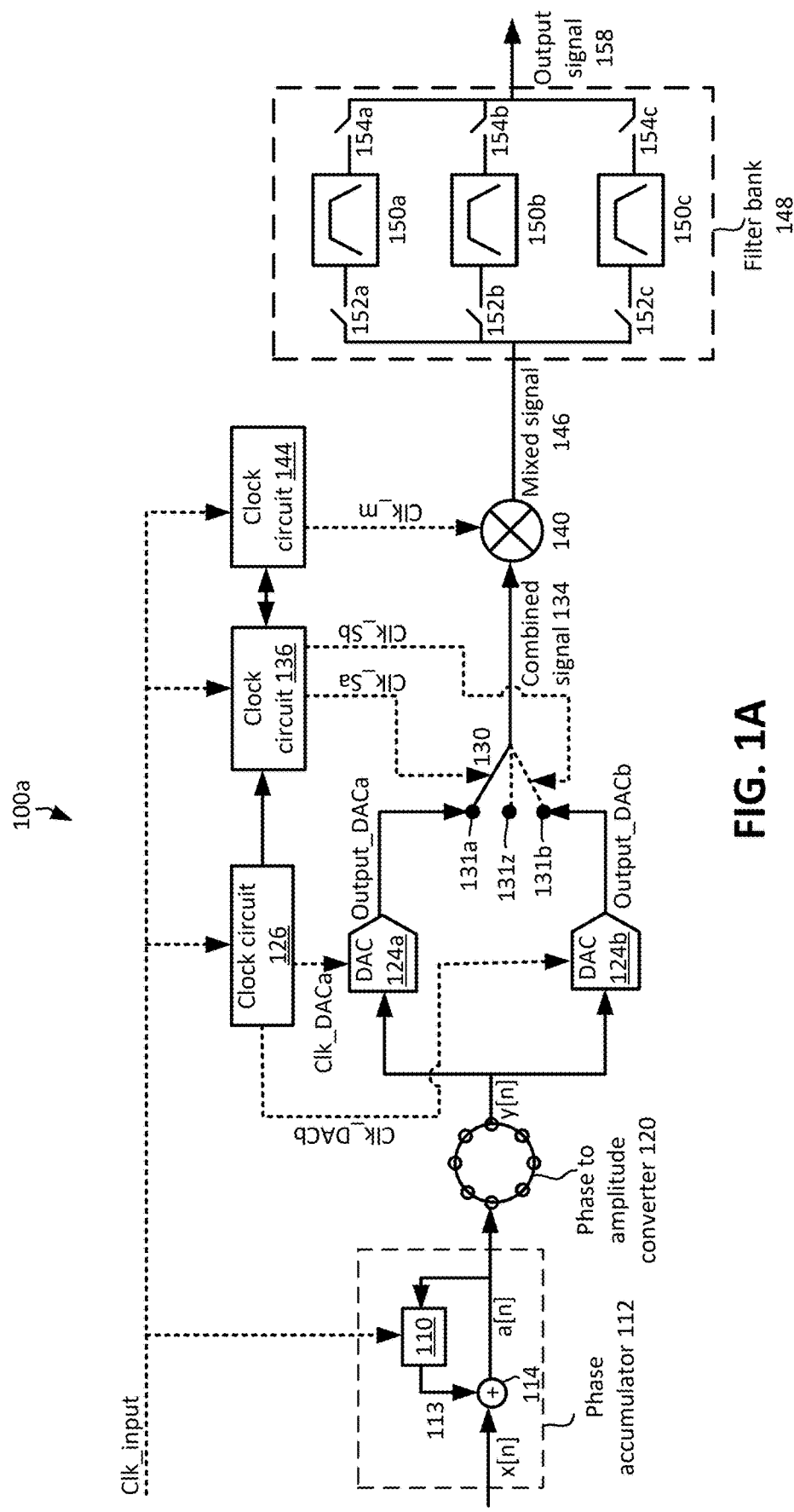
FIGS. 1A-B each schematically illustrates a direct digital synthesis (DDS) circuit with a plurality of digital to analog (DAC) converters and a signal mixer having a plurality of modes of operation, wherein a switch switches outputs of the DACs to the mixer, and wherein one or more of a plurality of clock signals to the switch are synchronized to one or more of a plurality of clock signals to the DACs, in accordance with an embodiment of the present disclosure.

Although the following detailed description will proceed with reference being made to illustrative examples, many alternatives, modifications, and variations thereof will be apparent in light of this disclosure.

DETAILED DESCRIPTION

Direct digital synthesis (DDS) circuitry is disclosed. In an example, a DDS includes a switch to multiplex outputs from multiple parallel DACs, to create a multiplexed or combined signal, and a multi-mode mixer capable of operating in a pass-through mode and a mixing mode. When operating in the pass-through mode, the mixer provides the combined signal as a mixed signal. When operating in the mixing mode, the mixer mixes the combined signal with a mixer clock signal, to generate the mixed signal. Respective clock signals to the multiple DACs and the switch may be synchronized, to eliminate or reduce noise attributable to the DACs and switching. For instance, in the example case where there are two DACs, the switch receives a first switch clock signal and a second switch clock signal. The switch (i) provides an output from a first DAC as a combined signal, when the first clock signal is high (high state), (ii) provides an output from a second DAC as the combined signal, when the second clock signal is high, and (iii) provides a zero voltage as the combined signal, when each of the first and second clock signals is low (low state). Because the DAC clock signals and the switch clock signals are synchronized, after the switch starts receiving a new output from a DAC, the switch effectively waits for at least a threshold time period Td, before providing the new output as the combined signal. Such a delay in providing the DAC output as the combined signal ensures that the DAC output has settled at its target final analog amplitude (or within an acceptable tolerance thereof), prior to providing DAC output as the combined signal. The pass-through and mixing modes of the mixer enable the mixer to generate any of (i) signals having a frequency of the digital amplitude signal that is provided to the DACs, when operating in the pass-through mode, (ii) signals having a sum of the frequency of the digital amplitude signal and a frequency of the mixer clock signal, when operating in the mixing mode, and (iii) signals having a difference of the frequency of the digital amplitude signal and the frequency of the mixer clock signal, when operating in the mixing mode. The mixer clock may also be synchronized with the switch clock signals. Such synchronization reduces noise and spurs in the DDS output. Numerous configurations and applications will be apparent in light of this disclosure.

General Overview

A DDS includes a phase accumulator and a phase to amplitude converter, which in combination generates a digital amplitude signal having a frequency that is a fraction of the input frequency. The digital amplitude signal is converted to its analog equivalent by a digital to analog (DAC) converter. Also, as described above, a DDS divides an input frequency (e.g., divides the input frequency by Q, where Q≥2), and thus, the output frequency is lower (such as at most half) the input frequency. In an example, the input frequency may be high, such as in the gigahertz range. Thus, the DAC has to operate at the high input frequency. However, operating the DAC at the high frequency may result in increased complexity and/or cost of the DAC.

Accordingly, techniques are described herein for a DDS circuit that uses multiple DACs in parallel, and a downstream switch multiplexes outputs from the multiple DACs, to generate a combined signal. Clock signals to the multiple DACs and switch are synchronized, which allows a given DAC output to sufficiently settle at its target analog amplitude prior to reporting that DAC output at the switch output. In one embodiment, a multi-mode mixer selectively mixes an output of the switch with a mixer clock signal, where the mixer can be configured to operate in a pass-through mode (where no mixing operation is performed) or a mixing mode (where the mixer selectively mixes the output of the switch with the mixer clock signal). Such modes of the mixer enable the mixer to generate any of (i) signals having a frequency of the digital amplitude signal that is provided to the DACs, when operating in the pass-through mode, (ii) signals having a sum of the frequency of the digital amplitude signal and a frequency of the mixer clock signal, when operating in the mixing mode, and (iii) signals having a difference of the frequency of the digital amplitude signal and the frequency of the mixer clock signal, when operating in the mixing mode. A bank of filters (e.g., bandpass) can then be used to pass a desired frequency from the output of the mixer.

Although some examples described herein include two or four DACs within the DDS, any number of DACs can be used (two or more). In the example where two DACs are used, each DAC respectively processes first and second samples of the digital amplitude signal generated by a phase accumulator and a phase to amplitude converter of the DDS. For example, a first DAC processes even samples of the digital amplitude signal, and a second DAC processes odd samples of the digital amplitude signal. The DAC outputs are received by the switch, which receives a first switch clock signal and a second switch clock signal. The switch (i) provides an output from the first DAC as the combined signal, when the first clock signal is high (high state), (ii) provides an output from the second DAC as the combined signal, when the second clock signal is high, and (iii) provides a zero voltage as the combined signal, when each of the first and second clock signals is low (low state).

In an example, the first switch clock signal and the second switch clock signal are synchronized with DAC clock signals supplied to the first and second DACs. Such synchronization ensures that, after the switch starts receiving a new output from a DAC, the switch waits for at least a threshold time period Td, prior to providing that new output as the combined signal. Such a delay ensures that the DAC output has fully settled, prior to providing DAC output as the combined signal. Such synchronization eliminates or at least reduces noise and spurs in the DDS output. The output of the switch can be a return to zero (RZ) signal, where the combined signal provided by the switch is reset to zero each time after outputting an analog value from a DAC. The combined signal generated by the switch is provided to the mixer, which may operate in a selected one of the pass-through mode or the mixing mode. The mixer generates a mixed signal, which is filtered by the filter bank. In one embodiment, the mixer clock is also synchronized with the first and second switch clock signals. Such synchronization further reduces noise and spurs in the DDS output.

Figure 1B:
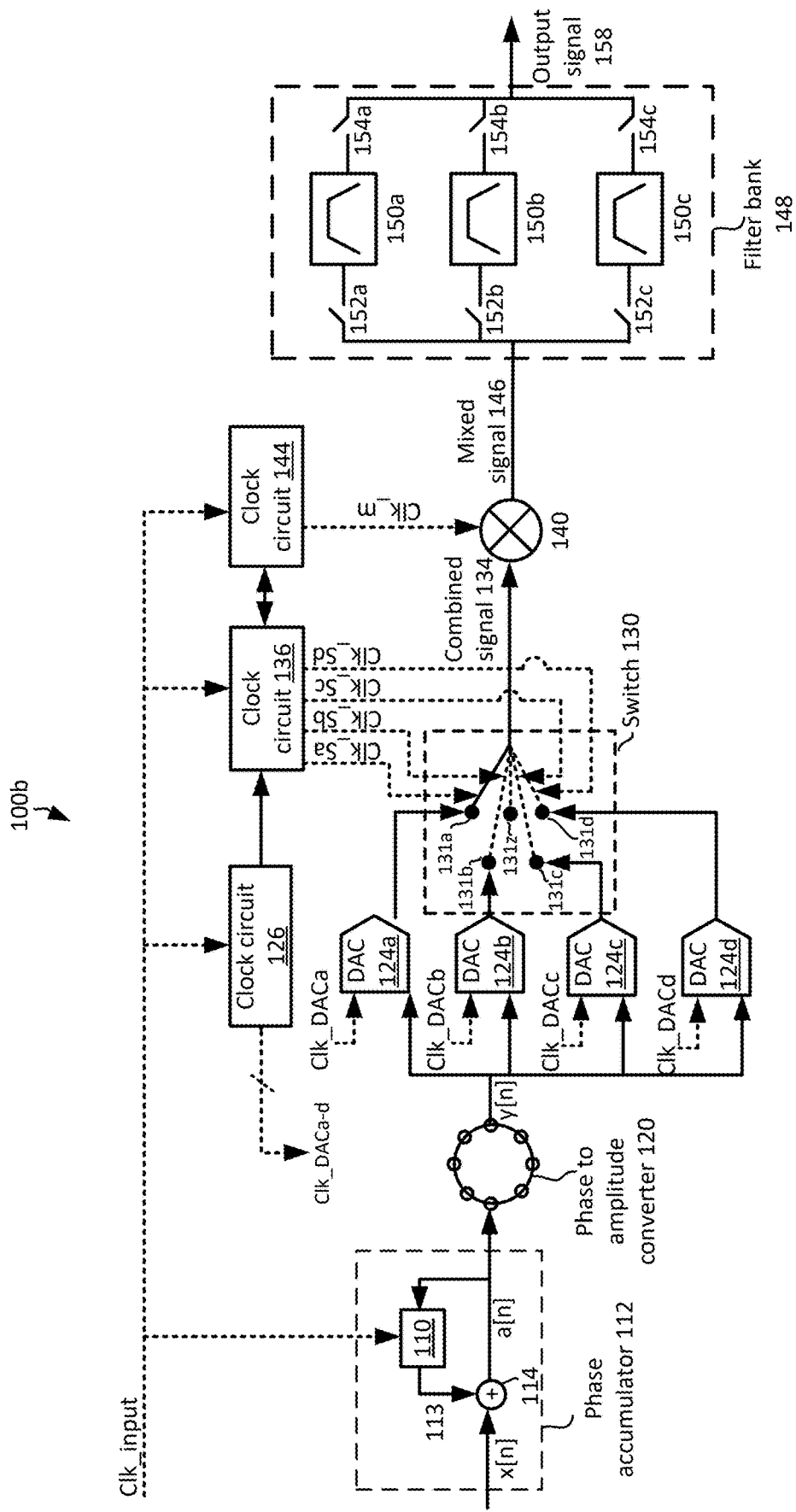

The switch can be scaled to accommodate additional DACs. For instance, in examples having two DACs the switch can be a 3:1 multiplexor (such as shown in the example of FIG. 1A), while in examples having four DACs the switch can be a 5:1 multiplexor (such as shown in the example of FIG. 1B). Numerous other configurations and variations will be apparent in light of this disclosure.

Architecture

FIG. 1A schematically illustrates a direct digital synthesis (DDS) circuit 100a with a plurality of digital to analog (DAC) converters 124a, 124b and a signal mixer 140 having a plurality of modes of operation, wherein a switch 130 switches outputs of the DACs 124a, 124b to the mixer 140, and wherein clock signals clk_Sa and clk_Sb to the switch 130 are synchronized to clock signals clk_DACa and clk_DACb to the DACs 124a, 124b, in accordance with an embodiment of the present disclosure.

The DDS circuit 100a comprises a phase accumulator 112 that receives a frequency control word (FCW) x[n], sampled on each cycle (n) of a clock input signal clk_input, and accumulates the FCW x[n] over time as accumulated phase signal a[n], also referred to as a phase accumulation signal. The phase accumulator 112 comprises a delay element 110 receiving the accumulated phase signal a[n], and generating a feedback signal 113. The feedback signal 113 and the FCW x[n] are added by a summer 114 to generate the accumulated phase signal a[n].

The phase accumulator 112 acts as a counter that has $2^N$ digital states, and may be incremented for each input clock pulse of the input clock clk_input. The increment step size is based on the FCW x[n] that is applied to the summer 114. For example, if x[n]=1, the increment step size is one, and the digital states are incremented by one state for each clock pulse. If x[n]=2, the increment step size is two, and the digital states are incremented by two states for each clock pulse, and so on. Thus, FCW x[n] configures a step size of the counter increment, and is used to control a frequency of the output waveform.

As described above, the phase accumulator 112 acts as a counter that has $2^N$ digital states, where N may be 12, 24, or 48, or another appropriate number. For example, for N=24, the phase accumulator 112 has digital 16,777,216 states. This number represents a number of phase values between 0 and $2\pi$ radians. The output of the phase accumulator, a[n], represents phase points on a sinusoidal waveform (e.g., phase angles). The phase accumulator 112 generates phase points that increments to step through the phase points for a complete cycle (e.g., the angular phase range of 0° to 360°, or phase range of 0 to $2\pi$ radians) of the sinusoidal waveform. As described above, a rate at which the phase signal a[n] increases, and hence an output frequency of the DDS 100a, is controlled by the FCW x[n].

Figure 2:
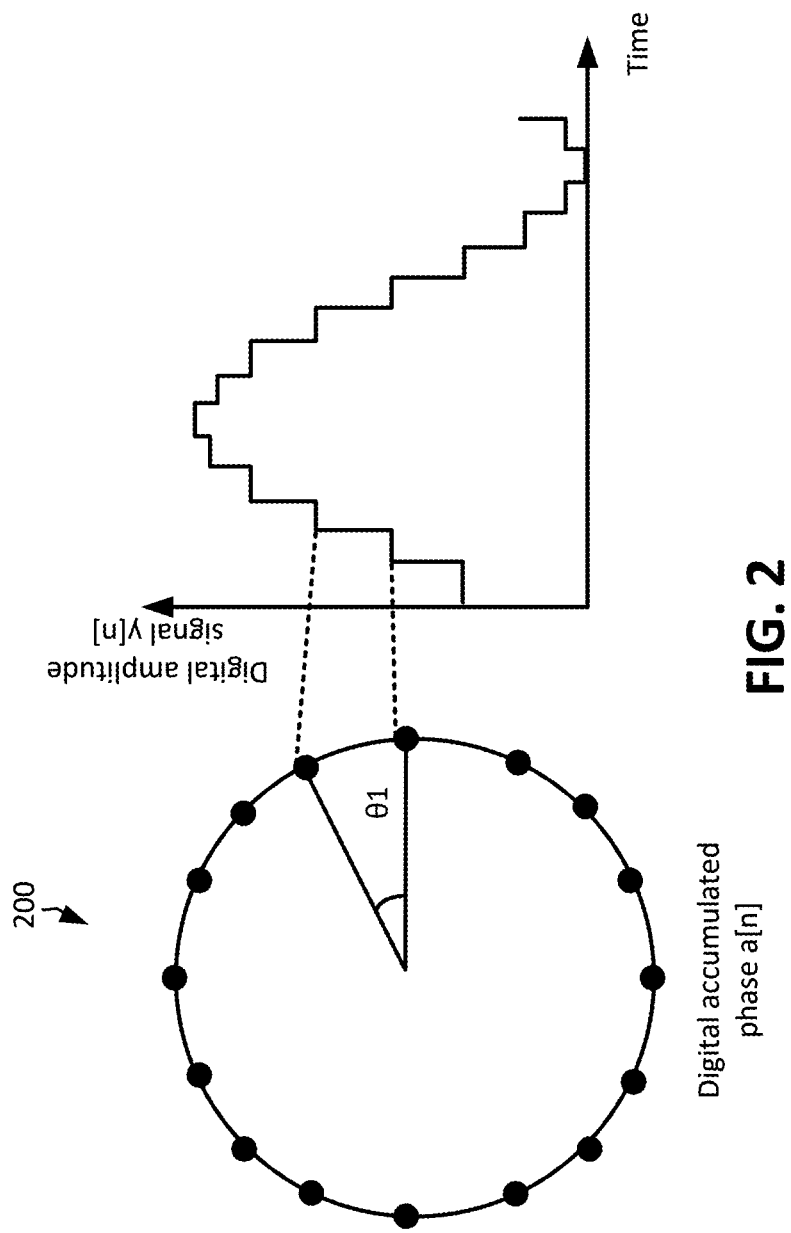
FIG. 2 illustrates an example mapping between an accumulated phase signal a[n] provided by a phase accumulator and a digital amplitude signal y[n] provided by a phase to amplitude converter of a DDS circuit, in accordance with an embodiment of the present disclosure.

The DDS 100a further comprises a phase to amplitude converter 120 configured to provide a digital amplitude signal y[n], which is representative of digital amplitude data corresponding to the phase points on the sinusoidal waveform associated with the digital accumulated phase signal a[n]. For example, for each value of the accumulated phase signal a[n], the phase to amplitude converter 120 generates a corresponding amplitude of the digital amplitude signal y[n]. FIG. 2 illustrates an example mapping 200 between an accumulated phase signal a[n] provided by the phase accumulator 112 and a digital amplitude signal y[n] provided by the phase to amplitude converter 120, in accordance with an embodiment of the present disclosure. For example, for a phase angle of θ1, the phase to amplitude converter 120 provides a corresponding amplitude of the digital amplitude signal y[n]. As the phase signal a[n] varies with time from 0 to $2\pi$ radians, the digital amplitude signal y[n] varies in the form of a digital sinusoidal wave. In an example, the phase to amplitude converter 120 includes a look-up table that maps a phase to a digital amplitude, or includes another circuit to map a phase to a digital amplitude.

The phase accumulator 112 and the phase to amplitude converter 120 operate at a clock frequency of the input clock clk_input. In an example, the clk_input is a relatively faster clock, and the DDS 100a provides an output signal 158 having a frequency that is substantially less than a frequency of the input clock clk_input. For example, the frequency of the output signal 158 can be at most ½ the frequency of the input clock clk_input. In an example, the frequency $f_{out}$ of the output signal 158 is represented as:

$$f_{out} = x[n] * f_{in} / 2^N \qquad \text{Equation 1}$$

where $f_{in}$ is the frequency of the input clock clk_input, x[n] is the FCW provided to the phase accumulator 112, and N is the length of the phase accumulator 112.

In an example, because the clk_input is a relatively faster clock (such as in the gigahertz range), the digital amplitude signal y[n] provided by the phase to amplitude converter 120 is parallelly processed by the plurality of DACs 124. In the embodiment shown in FIG. 1A, the DACs 124a, 124b receive the digital amplitude signal y[n], and process the digital amplitude signal y[n]. In such an example, the DAC 124a may process the odd samples of the digital amplitude signal y[n], and the DAC 124b may process the even samples of the digital amplitude signal y[n] (although in another example, the DACs 124a, 124b may respectively process the even and odd samples as well). Processing the digital amplitude signal y[n] in two (or more) parallel DACs 124 allows the DDS 100a to handle a relatively high frequency input clock clk_input, in an example.

As described above, the DACs 124a-b are configured to convert samples of the digital amplitude signal y[n] to their corresponding analog values. For example, the DAC 124a is to provide an analog signal output_DACa, and the DAC 124b is to provide an analog signal output_DACb. Thus, the analog signal output_DACa comprises analog voltage values representative of the odd (or even) samples of the digital amplitude signal y[n], and the analog signal output_DACb comprises analog voltage representative of the even (or odd) samples of the digital amplitude signal y[n].

As further shown in FIG. 1A, a clock circuit 126 receives the input clock clk_input, and generates a first DAC clock signal clk_DACa and a second DAC clock signal clk_DACb, which are respectively received by the DAC 124a and DAC 124b. Because the DAC 124a processes half of the samples of the digital amplitude signal y[n] and the DAC 124b processes half of the samples of the digital amplitude signal y[n], the DACs 124a, 124b operate at about half the speed of the clk_input. Thus, in an example, the clock circuit 126 divides the clk_input to generate clk_DACa and clk_DACb. In an example, the clk_DACb is an inverse of the clk_DACa. For example, the clk_DACb is a delayed version of the clk_DACa.

Figure 3A:
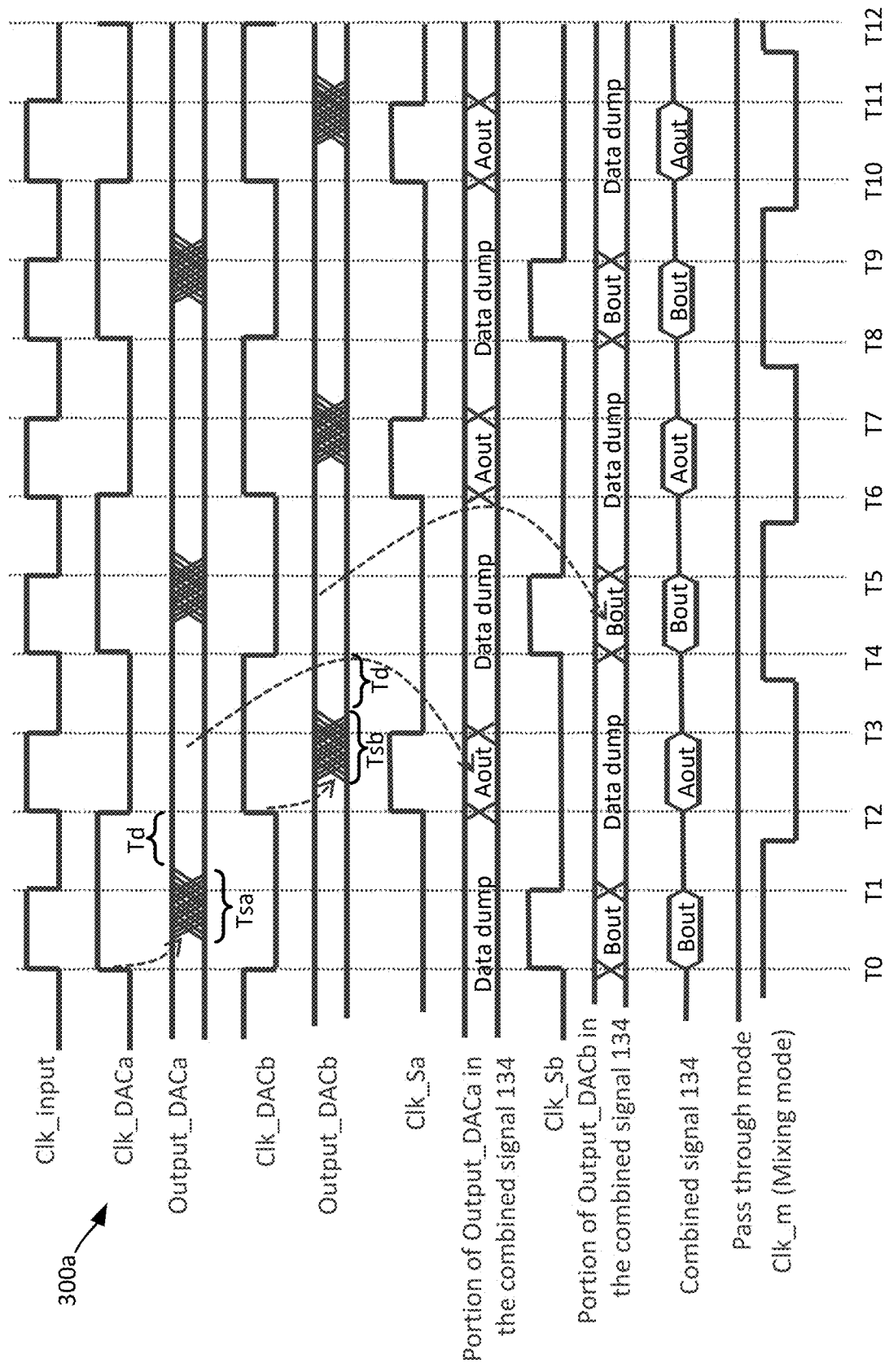
FIGS. 3A-B each illustrates a timing diagram depicting an operation of a DDS circuit, in accordance with an embodiment of the present disclosure.
Figure 4:
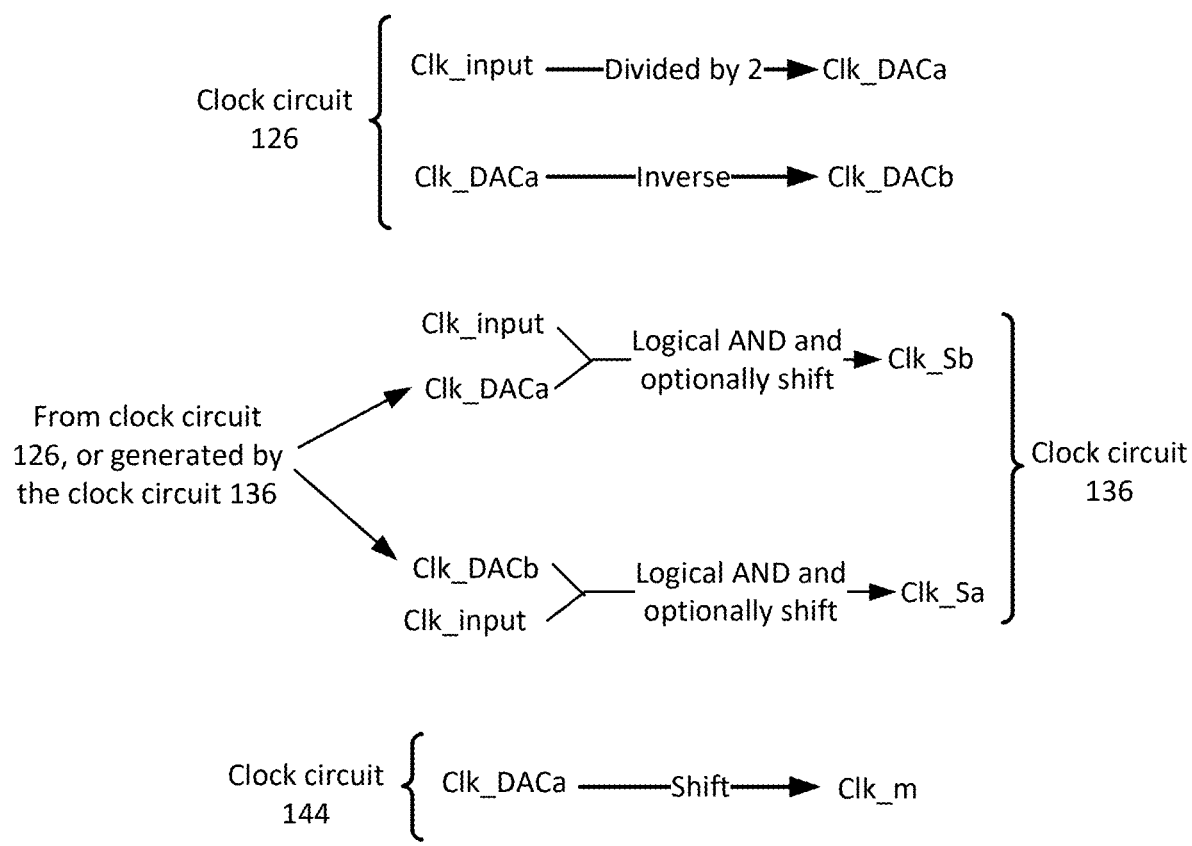
FIG. 4 illustrates various clock signals within a DDS circuit, in accordance with an embodiment of the present disclosure.

FIG. 3A illustrates a timing diagram 300 depicting an operation of the DDS 100a, in accordance with an embodiment of the present disclosure. FIG. 4 illustrates various clock signals within the DDS 100a, in accordance with an embodiment of the present disclosure.

As illustrated in FIG. 3A, the clk_DACa and clk_DACb, which are derived from the clk_input by the clock circuit 126, have half the frequency of the clk_input, and are inverse of each other. Thus, as illustrated in FIG. 4, the clk_DACa may be generated by a frequency divider within the clock circuit 126 from the clk_input, and the clk_DACb may be generated by inversing the clk_DACa within the clock circuit 126.

Referring again to FIG. 1A, in one embodiment, a switch 130 selectively receives the output_DACa and output_DACb signals, and combines or multiplexes the output_DACa and output_DACb signals to generate a combined signal 134. Thus, assuming that the DAC 124a processes odd samples of the digital amplitude signal y[n] and the DAC 124b processes even samples of the digital amplitude signal y[n], the switch 130 alternates between (i) the output_DACa, (ii) the output_DACb, and (iii) a reference voltage (e.g., which may be substantially zero), such that the combined signal 134 has analog versions of both the odd and even samples of the digital amplitude signal y[n].

For example, during a first clock pulse, the switch 130 provides an analog version of an odd sample of the digital amplitude signal y[n]; during a second clock pulse, the switch 130 provides a reference voltage (e.g., which may be substantially zero); during a third clock pulse, the switch 130 provides an analog version of an even sample of the digital amplitude signal y[n] and this cycle is repeated, such that the combined signal 134 is a reconstructed analog version of the digital amplitude signal y[n], as described below.

As illustrated in FIG. 1A, the switch 130 can be in one of three positions 131a, 131b, 131z. When in position 131a (this option is illustrated using a solid line in FIG. 1A), the switch 130 provides the output_DACa as the combined signal 134. When in position 131b (this option is illustrated using a dashed line in FIG. 1A), the switch 130 provides the output_DACb as the combined signal 134. When in position 131z (this option is illustrated using a dashed line in FIG. 1A), the switch 130 provides neither of the output_DACa or the output_DACb as the combined signal 134, and thus, combined signal 134 may be electrically floating or have a zero voltage. In an example, when in position 131z, the combined signal 134 is grounded by the switch 130, such that the combined signal 134 has substantially a zero voltage.

The DDS 100a comprises a clock circuit 136 configured to receive the input clock clk_input, and generate clock signals clk_Sa and clk_Sb. Each of clock signals clk_Sa and clk_Sb transitions between a high state (also referred to herein as the given clock being high) and a low state (also referred to herein as the clock being low). The clk_Sa controls the switch 130, such that the switch 130 moves to position 131a when clk_Sa is high. The clk_Sb also controls the switch 130, such that the switch 130 moves to position 131b when clk_Sb is high. When neither clk_Sa or clk_Sb is high (when both clk_Sa or clk_Sb are low), the switch 130 moves to the position 131z, and the switch 130 provides zero voltage.

Thus, when clk_Sa is high, the switch 130 provides output_DACa as the combined signal 134. On the other hand, when clk_Sb is high, the switch 130 provides output_DACb as the combined signal 134.

FIG. 3A also illustrates the clock signals clk_Sa and clk_Sb provided to the switch 130. As seen in FIG. 3A, clock signal clk_Sa may be generated by a logical AND operation between the clk_input and clk_DACb; and clock signal clk_Sb may be generated by a logical AND operation between the clk_input and clk_DACa, e.g., as also illustrated in FIG. 4. The clock signals clk_Sa and clk_Sb may also be shifted in time (after the logical AND operation), as described below with respect to FIG. 5. As illustrated in FIG. 3A, clock signal clk_Sa may be high when both clk_input and clk_DACb are high; and clock signal clk_Sb may be high when both clk_input and clk_DACa are high. Thus, when the clk_DACa is high and the DAC 124a is processing a sample of the digital amplitude signal y[n], the switch 130 provides the output_DACb from the DAC 124b as the combined signal 134. Similarly, when the clk_DACb is high and the DAC 124b is processing a sample of the digital amplitude signal y[n], the switch 130 provides the output_DACa from the DAC 124a as the combined signal 134.

In an example, the clock signal clk_Sa is switched high after the corresponding output_DACa has sufficient time to settle at or within an acceptable tolerance of the target final value (such as, for example, within at least 99% of the target final value). For example, referring at to the timing diagram of FIG. 3A, at time T0, clk_DACa goes high, and the DAC 124a starts processing an odd sample (although the sample may be even in another example) of the digital amplitude signal y[n]. The DAC 124a provides a corresponding amplitude of the odd sample of the digital amplitude signal y[n] at around (e.g., slightly before, during, or slightly after) time T1 (e.g., sometime during the time period Tsa), as analog signal output_DACa. For example, time period Tsa in FIG. 3A illustrates a range of transitioning and settling time of the analog signal output_DACa. The actual time when the DAC 124a starts transitioning the output_DACa may be somewhere within the time period Tsa, and may vary from one clock cycle to the next. Thus, the output_DACa may transition and settle at or within an acceptable tolerance of its target value at the beginning, middle, or towards the end of the time period Tsa. That is, the output_DACa may transition and settle some time before, at, or after time T1, as illustrated in FIG. 3A. The clk_Sa becomes high at time T2, e.g., subsequent to the time period Tsa. In one embodiment, there is at least a threshold time delay Td (see FIG. 3A) between the end of time period Tsa and time T2, so that the output_DACa has sufficient time to transition and settle at its target value. In an example, the threshold time delay Td may be at least a quarter of a clock cycle of the clk_input, or at least one-eighth of a clock cycle of the clk_input, or at least one half of a clock cycle of the clk_input.

Thus, prior to time T2, the switch 130 is not in position 131a, and hence, the output_DACa prior to time T2 is not provided by the switch 130. For example, the output_DACa prior to time T2 (e.g., form the start of transitioning sometime during the time period Tsa to the start of the time T2) is simply discarded by the DDS 100a, symbolically labelled as "data dump" in FIG. 3A. Between time T2 and T3 when clk_Sa is high, output_DACa from DAC 124a is switched by the switch 130 as the combined signal 134, which is symbolically labelled as Aout in FIG. 3A. For example, between about time T1 and about time T5, the DAC 124a generates the analog signal corresponding to the odd sample of the digital amplitude signal y[n], and this analog signal, after it has sufficiently settled during the time period Tsa, is provided by the switch 130 between time T2 and T3.

Similarly, in an example, the clock signal clk_Sb is switched high after the corresponding output_DACb has sufficient time to settle. For example, referring to the timing diagram of FIG. 3A, at time T2, clk_DACb goes high, and the DAC 124b starts processing an even sample (although the sample may be odd in another example) of the digital amplitude signal y[n]. The DAC 124b provides a corresponding amplitude of the even sample of the digital amplitude signal y[n] at around (e.g., slightly before, during, or slightly after) time T3 (e.g., sometime during the time period Tsb labelled in FIG. 3A), as analog signal output_DACb. For example, time period Tsb in FIG. 3A illustrates a range of transitioning and settling time of the analog signal output_DACb. The actual time when the DAC 124b starts transitioning the output_DACb may be somewhere within the time period Tsb, and may vary from one clock cycle to the next. Thus, the output_DACb may transition and settle at the beginning, middle, or towards the end of the time period Tsb. That is, the output_DACb may transition and settle some time before, at, or after time T3, as illustrated in FIG. 3A. The clk_Sb becomes high at time T4, e.g., subsequent to the time period Tsb. In one embodiment, there is at least the threshold time delay Td (see FIG. 3A) between the end of time period Tsb and time T4, so that the output_DACb has already transitioned and settled sufficiently at its target value (within an acceptable tolerance, as with other such DAC settling described herein). In an example, the threshold time delay Td may be at least one-quarter of a clock cycle, although other examples may use lower thresholds (e.g., at least one-eighth of a clock cycle) and still other examples may use higher thresholds (e.g., at least one half of a clock cycle of the clk_input).

Thus, prior to time T4, the switch 130 is not in position 131b, and hence, the output_DACb prior to time T4 is not provided by the switch 130. For example, the output_DACb prior to time T4 is simply discarded by the DDS 100a, symbolically labelled as "data dump" in FIG. 3A. Between time T4 and T5 when clk_Sb is high, output_DACb from DAC 124b is switched by the switch 130 as the combined signal 134, which is symbolically labelled as "Bout" in FIG. 3A. For example, between about time T3 and about time T7, the DAC 124b generates the analog signal corresponding to the even sample of the digital amplitude signal y[n], and this analog signal, after it has fully transitioned and settled during the time period Tsb, is provided by the switch 130 between time T4 and T5.

Switching an output of a DAC 124 (such as output_DACa, or output_DACb) to the combined signal 134, after the output has fully transitioned and settled at or within a threshold of its target value, results in relatively less noise in the combined signal 134. For example, the above described threshold time period Td ensures that only steady state and intended value of the DAC output is provided by the switch 130, and hence, spurs and spurious noises in the combined signal 134 is eliminated, or at least reduced, by synchronizing the clock signals clk_Sa and clk_Sb with the DAC clocks clk_DACa and clk_DACb.

Note that in the timing diagram 300, after outputting a corresponding signal from a corresponding DAC, the switch 130 periodically switches to position 131z, where no signal is output by the switch 130 (switch output is zero). In an example, at position 131z, the switch 130 couples its output to the ground, such that the combined signal 134 goes to zero every time the switch 130 is not providing data from a DAC 124. Thus, for example, the switch provides zero voltage between time T1 and T2, between time T3 and T4, between time T5 and T6, and so on. The switch 130 provides the output_DACa as the combined signal 134 between time T2 and T3, between time T6 and T7, and so on. The switch 130 provides the output_DACb as the combined signal 134 between time T0 and T1, between time T4 and T5, and so on. Thus, after providing data from a DAC 124, the output of the switch 130 goes to zero. Thus, the switch 130, as well as the DDS 100a, operates as a return to zero (RZ) DDS, where the switch output 130 is reset to zero each time after outputting an analog value of a corresponding sample of the digital amplitude y[n].

The DDS 100a further comprises a mixer 140 configured to selectively mix the combined signal 134 with a mixer clock signal clk_m generated by a clock circuit 144. In an example, the mixer 140 is configured to operate in one of two modes of operation, (i) a pass-through mode of operation, and (ii) a mixing mode of operation. The mode can be selected, for instance, based on the frequency of the desired output (output signal 158).

In the pass-through mode of operation, the mixer clock signal clk_m is held constant (e.g., at a high state, but may be different to account for factors such as isolation and device stress) and no mixing operation occurs, represented by a straight line in FIG. 3A. Thus, a mixed signal 146 provided by the mixer 140 is substantially the same as the combined signal 134.

In the mixing mode of operation, the mixer clock signal clk_m is toggling between high and low states, and the mixer 140 mixes the combined signal 134 with the clock signal clk_m. The mixer clock signal clk_m may be derived, for example, by shifting the clk_DACa (or the clk_DACb) by an appropriate time, or by similarly dividing and offsetting clk_input. In the example shown in FIG. 3A, the clock circuit 144 shifts the clk_m signal, such that: (i) each low phase of the clk_m is substantially centered around or otherwise corresponds to the time when the switch 130 provides data from DAC 124a as the combined signal 134, and (ii) each high phase of the clk_m is substantially centered around or otherwise corresponds to the time when the switch 130 provides data from DAC 124b as the combined signal 134.

For example, the switch 130 provides data from DAC 124a (e.g., data Aout) between time T2 and T3, and the clk_m is low from slightly before time T2 and slightly after time T3, as illustrated in FIG. 3A. Similarly, the switch 130 provides data from DAC 124b (e.g., data Bout) between time T4 and T5, and the clk_m is high from slightly before time T4 and slightly after time T5. Thus, the clk_m is synchronized with clk_Sa and clk_Sb, and the clock circuit 144 communicates with the clock circuit 136 (as shown in FIG. 1A). Synchronizing the clk_m with clk_Sa and clk_Sb may help reduce impact of phase noise of the mixer clock clk_m on the mixed signal 146.

Thus, assuming that the frequency of the digital amplitude signal y[n] is $f_{out}$ (see equation 1 above), in the pass-through mode, the mixed signal 146 has frequency components centered around frequency $f_{out}$. In the mixing mode, assuming that the clk_m has a frequency of $f_m$, then mixed signal 146 includes frequencies centered around $f_{out}+f_m$, and also includes frequencies centered around $f_{out}-f_m$.

The mixer mode may be chosen or otherwise selected, for example, by a user, or a processor or controller, based on the frequency of the desired output, according to some examples. If the desired output frequency is relatively low, the pass-through mode can be used; otherwise, the mixer mode can be used. For instance, in one such example, if the desired frequency of output signal 158 is less than one-third of the sampling clock (~clk_input/3), then the pass-through mode can be used; otherwise, mixer mode can be used. In another such example, if the desired frequency of output signal 158 is less than one-half of the sampling clock (~clk_input/2), then the pass-through mode can be used; otherwise, mixer mode can be used. Such configurations may be helpful, for example, to ease spur filtering (which may include harmonic filtering). Other examples may select the mode of the mixer differently.

The DDS 100a further comprises a filter bank 148. In an example, the filter bank 148 is part of the DDS 100a. In another example, the filter bank 148 may be external to or otherwise separate from the DDS 100a. The filter bank 148 comprises a first filter 150a (such as a bandpass filter 150a) coupled to the output of the mixer 140 by switch 152a, a second filter 150b (such as a bandpass filter 150b) coupled to the output of the mixer 140 by switch 152b, and a third filter 150c (such as a bandpass filter 150c) coupled to the output of the mixer 140 by switch 152c. The outputs of filters 154a-c are respectively coupled to a common output by switches 154a, 154b, 154c, to provide the DDS output signal 158.

In operation, the filter 150a is configured to allow frequencies centered around $f_{out}$ to pass through it. Thus, in the pass-through mode of operation of the mixer 140, the filter 150a is operated (e.g., by switching switches 152a, 154a on, and switches 152b, 154b, 152c, 154c off), such that the output signal 158 has a frequency of $f_{out}$.

The filter 150b is configured to allow frequencies centered around ($f_{out}+f_m$) to pass through it, and the filter 150c is configured to allow frequencies centered around ($f_{out}-f_m$) to pass through it. Thus, in the mixing mode of operation of the mixer 140, the mixed signal 146 has signals having frequency ($f_{out}+f_m$), as well as signals having frequency ($f_{out}-f_m$). Depending on the desired output of the DDS 100a, any one of the filters 150b or 150c may be activated (e.g., by switching the corresponding switches 152 and 154 on), such that the output signal 158 has either frequency ($f_{out}+f_m$) or frequency ($f_{out}-f_m$).

As described herein above, in one embodiment and as illustrated in FIG. 4, clock signal clk_Sa may be generated by a logical AND operation between the clk_input and clk_DACb, and clock signal clk_Sb may be generated by a logical AND operation between the clk_input and clk_DACa. In an example, the generated clk_Sa and/or clk_Sb may be shifted in time (such as by introducing an adaptive delay), such that (i) clk_Sa becomes high only a threshold time after full settling of the analog signal output_DACa, and/or (i) clk_Sb becomes high only a threshold time after full settling of the analog signal output_DACb.

Note that while FIG. 1A illustrates a DDS including two DACs 124a, 124b, another example DDS may include more than two DACs, such as four, eight, or sixteen DACs. For instance, if there were four DACs, for example, the four DACs may process the first, second, third, and fourth samples, respectively, and this process may repeat in a loop. Such an example is illustrated in FIG. 1B. Relevant description of similar parts with respect to FIG. 1A is equally applicable to corresponding parts of FIG. 1B.

As shown in FIG. 1B, each of DACs 124a, 124b, 124c, 124d receive the digital amplitude signal y[n]. DAC 124a processes a first sample of the digital amplitude signal y[n], DAC 124b processes a second sample of the digital amplitude signal y[n], DAC 124c processes a third sample of the digital amplitude signal y[n], and the DAC 124d processes a fourth sample of the digital amplitude signal y[n]. The switch 130 then interleaves the DAC outputs to mixer 140, responsive to switch clock signals clk_Sa, clk_Sb, clk_Sc, and clk_Sd. This process repeats for the next four samples, and so on. According to some such embodiments, an in-phase and quadrature (I/Q) clocking scheme can be used to generate the clock signals that control DACs 124a-d and switch 130.

Figure 3B:
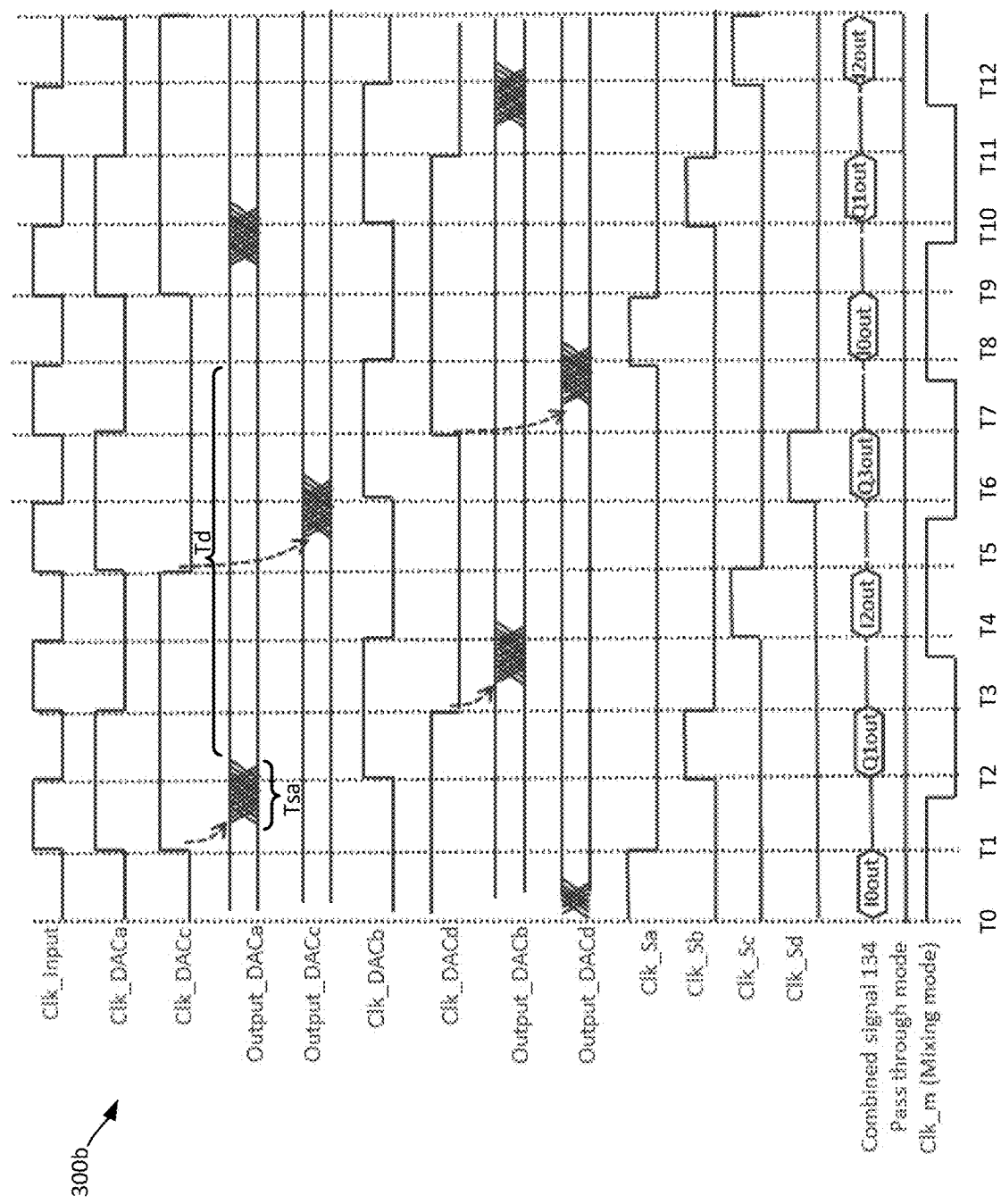

In more detail, and with further reference to FIG. 1B, clock circuit 126 receives the input clock clk_input, and generates DAC clock signals clk_DACa, clk_DACb, clk_DACc, and clk_DACd, which are respectively received by DAC 124a, DAC 124b, DAC 124c, and DAC 124d. Similarly, clock circuit 136 receives clk_input, and generates switch clock signals clk_Sa, clk_Sb, clk_Sc, and clk_Sd, which are all received by switch 130. Because each of the DACs 124a-d processes one-quarter of the samples of the digital amplitude signal y[n], the DACs 124a-d operate at about one-quarter the speed of the clk_input. Thus, in an example, the clock circuit 126 divides the clk_input to generate a one-half clock signal and a one-quarter clock signal to provide clk_DACa and clk_DACc, respectively, which may be thought of as the in-phase (I) clocks or even clocks. Also, these clock signals clk_DACa and clk_DACc are offset by one-quarter clock cycle to provide clk_DACb and clk_DACd, respectively, which may be thought of as the quadrature (Q) clocks or odd clocks. FIG. 3B illustrates one such example of a four DAC configuration as shown in FIG. 1B. Note how DAC output signals output_DACa, output_DACb, output_DACc, and output_DACd are repeatedly interleaved into the combined signal 134 over a period of time TO through T12, in a similar fashion as explained with respect to the examples of FIGS. 1A and 3A. Further note that clock signals clk_Sa, clk_Sb, clk_Sc, and clk_Sd use the low pulse of the input clock clk_input rather than the high pulse as in the example two DAC case illustrated in FIGS. 1A and 3A. Either way is fine, as long as a consistent approach is used in lining up the clocks.

Note how the threshold time delay Td may be longer for a configuration having four DACs, rather than two DACs. For instance, the output_DACa may transition and settle some time before, at, or after time T1, as illustrated in FIG. 3B. The clk_Sa becomes high at around time T8, e.g., subsequent to the time period Tsa. In this example case, there is at least a threshold time delay Td (see FIG. 3B) between the end of time period Tsa and time T8, so that the output_DACa has sufficient time to transition and settle at its target value. Further note that the threshold time delay Td may be multiple clock cycles of the clk_input (in this example case, Td is three clock cycles of the clk_input. Similar description also applies to the other clock signals clk_Sb-d, as will be appreciated.

In one such example case, clock signals clk_Sa-d, can be generated as logical operations based on the clk_input and the one-half (½) clocks. For instance: clk_Sa=~clk_input &&~½ clk_input; clk_Sb=~clk_input &&~½ clk_input; clk_Sc=~clk_input && ½ clk_input; and clk_Sd=~clk_input && ½ clk_input; wherein && represents a logical AND operation, and ~ represents the logical inverse of the corresponding clock. The I and Q clocks can be offset by half clock cycles and the corresponding logical operations would correspondingly change. There may also be delay adjustments to further help align the clocks to within an acceptable tolerance for a given application.

Figure 5:
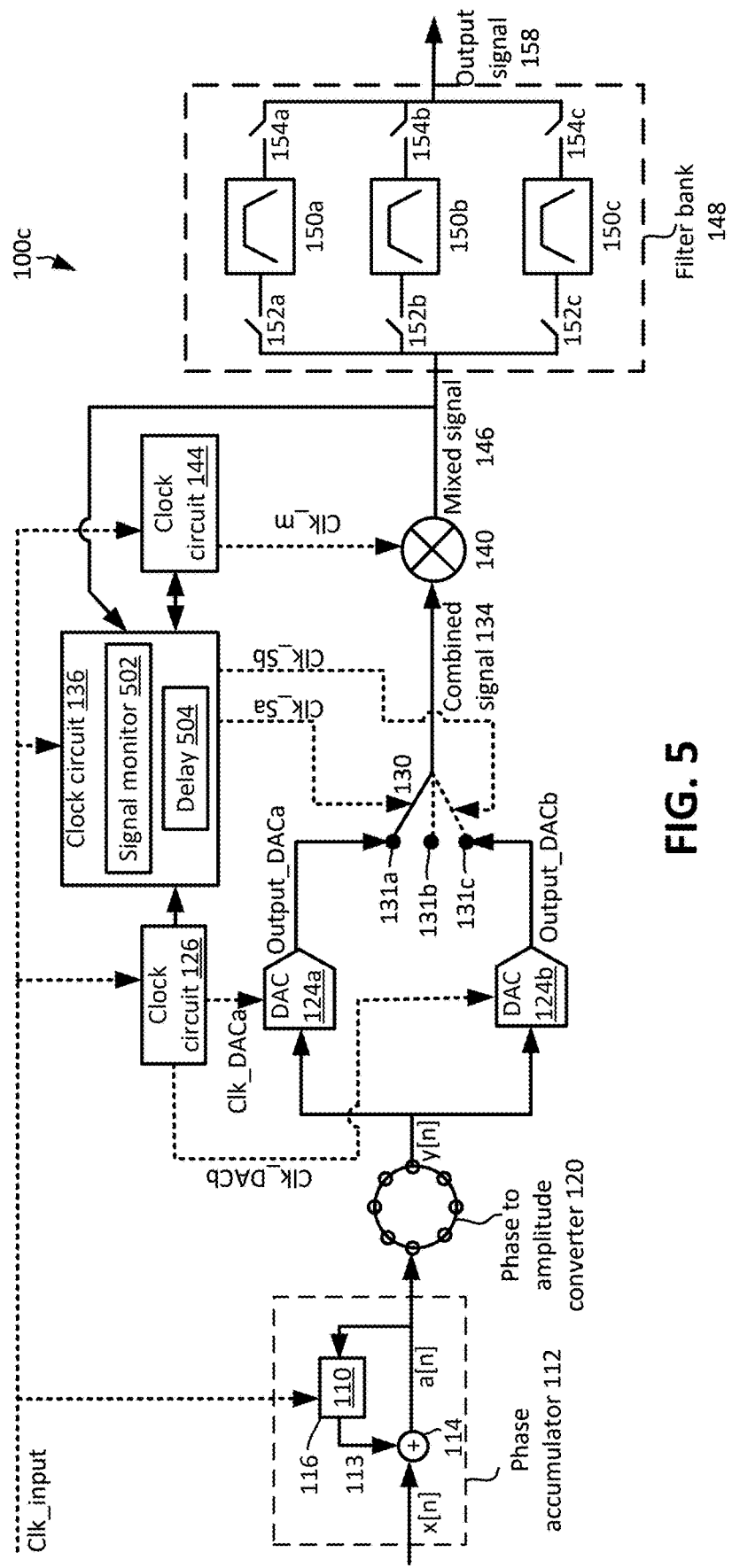
FIG. 5 illustrates a delay logic for selectively shifting clock signals provided to a switch of a DDS circuit, so as to reduce noise in the output of a DDS circuit, in accordance with an embodiment of the present disclosure.

FIG. 5 illustrates a delay logic 504 for selectively shifting the clk_Sa and clk_Sb signals provided to the switch 130 of a DDS 100c, so as to reduce noise in the output of the DDS 100c, in accordance with an embodiment of the present disclosure. DDS 100c is similar to DDS 100a, but the selective shifting can be implemented with other examples as well, such as the example shown in FIG. 1B, and those relevant descriptions are equally applicable here. In more detail, a signal monitor circuit 502 of the clock circuit 136 receives feedback of the mixed signal 146, and monitors noise in the mixed signal 146. In an example, the delay logic 504 delays or shifts the clk_Sa and/or clk_Sb signals, until the noise or spurs in the mixed signal 146 is eliminated or at least reduced.

For example, the delay logic 504 is configured to tune the time between (i) an output of a DAC 124 sufficiently settling, and (ii) the output of the DAC 124 being provided by the switch 130 as the mixed signal 134, such that the output of the DAC 124 is provided by the switch 130 only after the output of a DAC 124 sufficiently settles. In an example, the clk_Sa and/or clk_Sb may be delayed during a calibration phase of the DDS 100c, and/or the delay may be updated periodically or during start-up of the DDS 100c.

Figure 6:
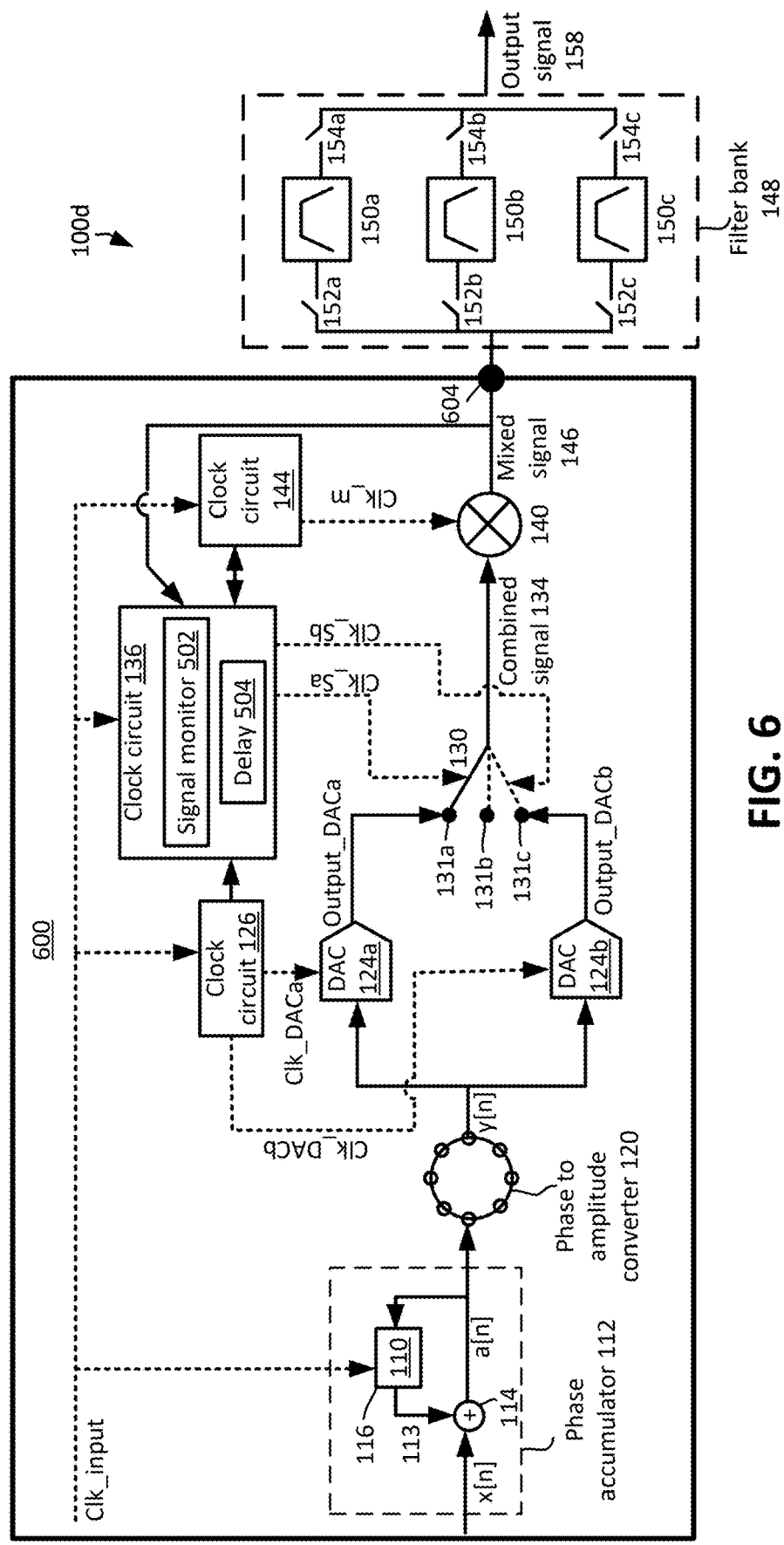
FIG. 6 illustrates an integrated circuit chip including a DDS circuit, in accordance with an embodiment of the present disclosure.

FIG. 6 illustrates an integrated circuit chip 600 including a DDS 100d, in accordance with an embodiment of the present disclosure. DDS 100d is similar to DDS 100a, but such integration can be used with other examples as well, such as the example shown in FIG. 1B, and those relevant descriptions are equally applicable here. In more detail, the phase accumulator 112, the phase to amplitude converter 120, the DACs 124a, 124b, the switch 130, the mixer 140, and the clock circuits 126, 136, 144 are internal to the chip 600, while the filter bank 149 is external to the chip 600. In other examples, filter bank 148 or a part thereof may be integrated within chip 600. Still other examples may be integrated in a different manner (e.g., a chip set, or a combination of one or more chips and one or more components external to the one or more chips). The mixed signal 146 is available at an output pin 604 of the chip 600. The clk_input may be generated internally within the chip 600, or may be supplied from outside the chip 600. In an example, the clk_input may be generated by an oscillator, a phase locked loop (PLL), or another clock source that can generate a high frequency clock signal, e.g., either within the chip 600 or external to the chip 600.

Figure 7:
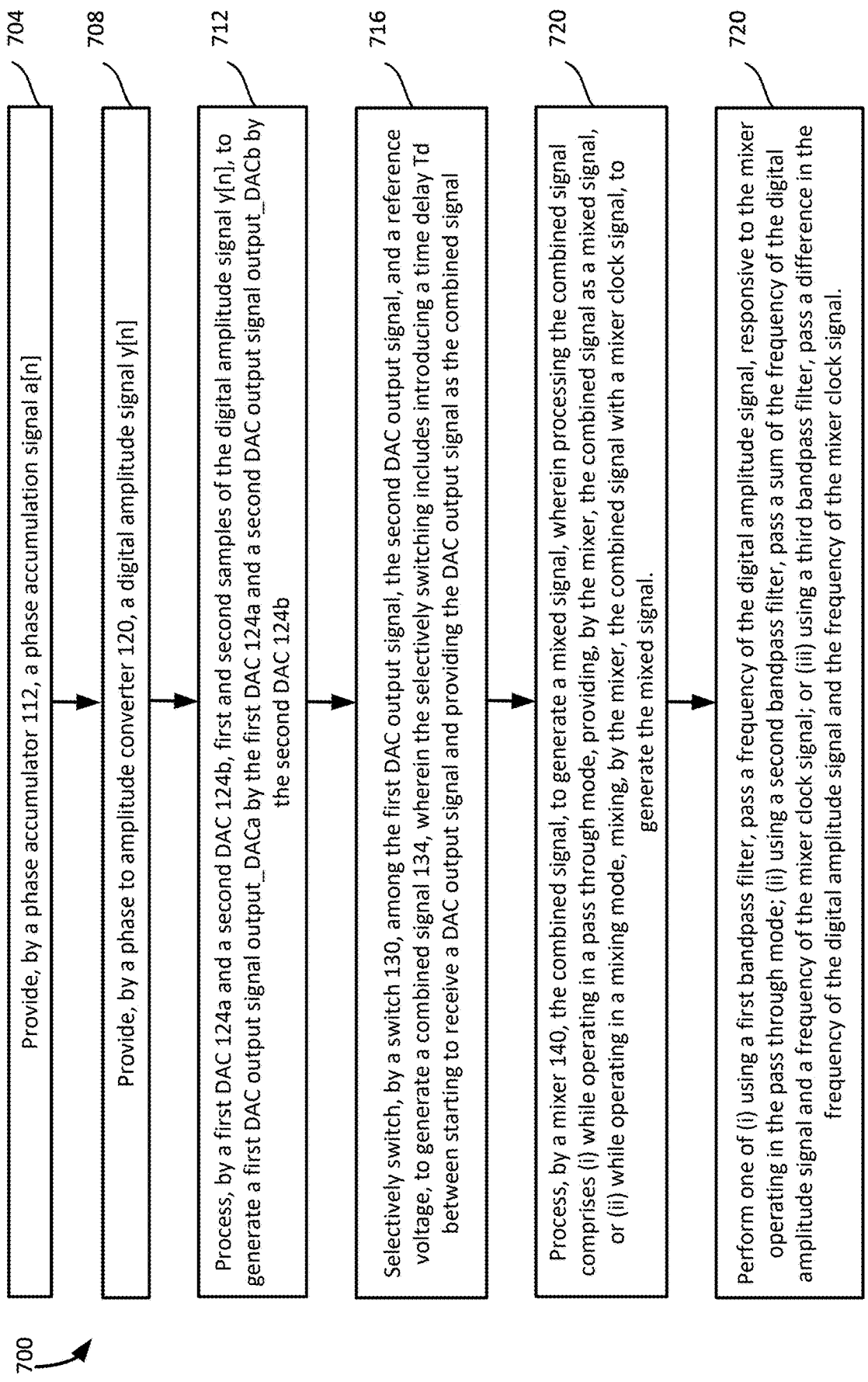
FIG. 7 illustrates a flowchart depicting a method of operating a DDS circuit, in accordance with an embodiment of the present disclosure.

FIG. 7 illustrates a flowchart depicting a method 700 of operating a DDS circuit, in accordance with an embodiment of the present disclosure. Reference may be made to the examples shown in FIGS. 1A-B, but the methodology can readily be applied to other configurations. Referring to FIG. 7, the method 700 comprises, at 704, providing, by a phase accumulator 112, a phase accumulation signal a[n], as described above. The method 700 further includes, at 708, providing, by a phase to amplitude converter 120, a digital amplitude signal y[n], as also described above.

The method 700 proceeds from 708 to 712. At 712, a first DAC 124a and a second DAC 124b respectively process first and second samples of the digital amplitude signal y[n], to respectively generate a first DAC output signal output_DACa and a second DAC output signal output_DACb. For example, the DAC 124a may process odd samples and the DAC 124b may process even samples, or vice-versa. More generally, N samples can be respectively processed by N DACs, to respectively generate N DAC output signals, where N is an integer of two (2) or higher. For instance, in the case of a four DAC configuration, a first sample is processed by a first DAC; a second sample is processed by a second DAC; a third sample is processed by a third DAC; and a fourth sample is processed by a fourth DAC. The next four samples may be similarly processed, and so on.

The method 700 proceeds from 712 to 716. At 716, the switch 130 selectively switches among the two or more DAC output signals and a reference voltage (e.g., which may be substantially zero), to generate a combined signal 134, as described with respect to the examples of FIGS. 1A-B and 3A-B. In an example, the selectively switching includes introducing a time delay Td between starting to receive a DAC output signal and providing the DAC output signal as the combined signal. For instance, as illustrated in the example of FIG. 3A, the switch 130 starts receiving a new value of the output_DACa from about time T1, and the switch 130 introduces a delay of at least Td, such that the switch 130 provides the output_DACa as the combined signal 134 from time T2.

The method 700 proceeds from 716 to 720. At 720, the mixer 140 processes the combined signal 134 to generate a mixed signal 146. In an example, processing the combined signal comprises (i) while operating in a pass-through mode, providing, by the mixer, the combined signal as a mixed signal, or (ii) while operating in a mixing mode, mixing, by the mixer, the combined signal with a mixer clock signal, to generate the mixed signal 146. In an example, the mixer clock signal clk_m is also synchronized with the clock signals clk_Sa and/or clk_Sb, as also described above.

The method 700 proceeds from 720 to 724. At 724, the filter bank 148 performs one of (i) using a first bandpass filter 150a to pass a frequency of the digital amplitude signal, responsive to the mixer operating in the pass-through mode; (ii) using a second bandpass filter 150b to pass a sum of the frequency of the digital amplitude signal and a frequency of the mixer clock signal, responsive to the mixer operating in the mixing mode; or (iii) using a third bandpass filter 150c to pass a difference in the frequency of the digital amplitude signal and the frequency of the mixer clock signal, responsive to the mixer operating in the mixing mode. As described above, the mixer mode can be selected, for instance, based on the frequency of the desired output (output signal 158).

Note that the processes in method 700 are shown in a particular order for ease of description. However, one or more of the processes may be performed in a different order or may not be performed at all (and thus be optional), in accordance with some embodiments. Numerous variations on method 700 and the techniques described herein will be apparent in light of this disclosure.

FURTHER EXAMPLES

The following examples pertain to further examples, from which numerous permutations and configurations will be apparent.

Example 1 is a direct digital synthesis (DDS) device. The device includes a first digital to analog converter (DAC) and a second DAC, wherein the first and second DACs are configured to respectively process first and second samples of an input signal. The device further includes switch configured to receive a first DAC output signal from the first DAC and a second DAC output signal from the second DAC, and selectively switch among at least the first DAC output signal and the second DAC output signal to generate a combined signal. The device further includes a multi-mode mixer configured to receive the combined signal and a mixer clock signal, and to operate in (i) a pass-through mode where the combined signal is provided as a mixed signal and (ii) a mixing mode where the combined signal is mixed with the mixer clock signal, to generate the mixed signal.

Example 2 includes the device of Example 1, and further includes a clock circuit configured to receive an input clock signal, and generate a first switch clock signal and a second switch clock signal. The switch is configured to (i) provide the first DAC output signal as the combined signal responsive to the first switch clock signal having a high state, (ii) provide the second DAC output signal as the combined signal responsive to the second switch clock signal having a high state, and (iii) provide a substantially zero voltage as the combined signal responsive to each of the first and second switch clock signals having a low state.

Example 3 includes the device of Example 2, wherein the clock circuit is configured to: generate the first switch clock signal, such that at least a threshold time period after the first DAC has started providing the first DAC output signal, (i) the first switch clock signal transitions to the high state and (ii) the switch allows the first DAC output signal to be provided as the combined signal; and generate the second switch clock signal, such that at least the threshold time period after the second DAC has started providing the second DAC output signal, (i) the second switch clock signal transitions to the high state and (ii) the switch allows the second DAC output signal to be provided as the combined signal.

Example 4 includes the device of Example 3, wherein the first and second DAC output signals are first and second analog amplitude values, respectively.

Example 5 includes the device of Example 3 or 4, wherein the threshold time period is at least one-eighth of a clock cycle of the input clock signal.

Example 6 includes the device of any one of Examples 2 through 5, wherein the clock circuit is a first clock circuit, and the DDS device comprises a second clock circuit configured to receive the input clock signal and generate the mixer clock signal, and wherein the mixer clock signal is synchronized with the first switch clock signal and/or the second switch clock signal.

Example 7 includes the device of Example 6, wherein the mixer clock signal: transitions to a low state when the first switch clock signal is at a low state; remains at the low state when the first switch clock signal transitions to a high state; and remains at the low state when the first switch clock signal transitions back from the high state to the low state.

Example 8 includes the device of Example 6 or 7, wherein the mixer clock signal: transitions to a high state when the second switch clock signal is at a low state; remains at the high state when the second switch clock signal transitions to a high state; and remains at the high state when the second switch clock signal transitions back from the high state to the low state.

Example 9 includes the device of any one of Examples 1 through 8, and further includes a third DAC and a fourth DAC. The third and fourth DACs are configured to respectively process third and fourth samples of the input signal. The switch is configured to receive a third DAC output signal from the third DAC and a fourth DAC output signal from the fourth DAC, and selectively switch among the first DAC output signal, the second DAC output signal, the third DAC output signal, and the fourth DAC output signal to generate the combined signal.

Example 10 includes the device of Example 9, wherein: the clock circuit configured to generate a third switch clock signal and a fourth switch clock signal; and the switch is configured to (iii) provide the third DAC output signal as the combined signal responsive to the third switch clock signal having a high state, (iv) provide the fourth DAC output signal as the combined signal responsive to the fourth switch clock signal having a high state, and (v) provide a substantially zero voltage as the combined signal responsive to each of the first, second, third, and fourth switch clock signals having a low state.

Example 11 includes the device of any one of Examples 1 through 10, and further includes: a phase accumulator configured to receive a frequency code word and an input clock signal, and provide a phase accumulation signal; and a phase to amplitude converter configured to receive the phase accumulation signal, and convert the phase accumulation signal to generate the input signal.

Example 12 includes the device of any one of Examples 1 through 11, and further includes a filter bank configured to process the mixed signal from the multi-mode mixer, the filter bank including one, two, or all three of: a first bandpass filter configured to pass a frequency of the input signal; a second bandpass filter configured to pass a sum of the frequency of the input signal and a frequency of the mixer clock signal; a third bandpass filter configured to pass a difference in the frequency of the input signal and the frequency of the mixer clock signal.

Example 13 is an integrated circuit that includes the device any one of Examples 1 through 12.

Example 14 is an apparatus that includes at least a first digital to analog converter (DAC) and a second DAC, and a switch. The first DAC is configured to process a first sample of a digital input signal and provide a first analog voltage, and the second DAC is configured to process a second sample of the digital input signal and provide a second analog voltage. The switch is configured to (i) start receiving the first analog voltage from a first time, and start providing the first analog voltage as a combined signal at least after a threshold time delay from the first time, and (ii) start receiving the second analog voltage from a second time, and start providing the second analog voltage as a combined signal at least after a threshold time delay from the second time.

Example 15 includes the apparatus of Example 14, wherein the switch is configured to provide a zero voltage as the combined signal, between providing the first analog voltage as the combined signal and providing the second analog voltage as the combined signal.

Example 16 includes the apparatus of Example 14 or 15, and further includes: a first a clock circuit configured to receive an input clock signal, and generate a first DAC clock signal for the first DAC, and generate a second DAC clock signal for the second DAC; and a second a clock circuit configured to receive the input clock signal, and generate a first switch clock signal and a second switch clock signal for the switch. The switch is configured to (i) provide the first analog voltage as the combined signal responsive to the first switch clock signal having a high state, (ii) provide the second analog voltage as the combined signal responsive to the second switch clock signal having a high state, and (iii) provide a substantially zero voltage as the combined signal responsive to each of the first and second switch clock signals having a low state.

Example 17 includes the apparatus of any one of Examples 14 through 16, wherein the threshold time delay is at least one-quarter or one-eighth of a clock cycle of an input clock signal.

Example 18 includes the apparatus of any one of Examples 14 through 17, and further includes: a signal mixer configured to receive the combined signal and a mixer clock signal, wherein the signal mixer is a multi-mode mixer configured to operate in (i) a pass-through mode where the combined signal is provided as a mixed signal, and (ii) a mixing mode where the combined signal is mixed with the mixer clock signal, to generate the mixed signal.

Example 19 includes the apparatus of any one of Examples 14 through 18, and further includes: a phase accumulator configured to receive a frequency code word and an input clock signal, and provide a phase accumulation signal; and a phase to amplitude converter configured to receive the phase accumulation signal, and generate the digital signal.

Example 20 is a method, which includes: generating, by a phase to amplitude converter, a digital amplitude signal; respectively processing, by a first digital to analog converter (DAC) and a second DAC, first and second samples of the digital amplitude signal, to generate a first DAC output signal by the first DAC and a second DAC output signal by the second DAC; selectively switching, by a switch, among at least the first DAC output signal, the second DAC output signal, and a reference voltage, to generate a combined signal; and processing, by a multi-mode mixer, the combined signal, to generate a mixed signal, wherein processing the combined signal comprises (i) while operating in a pass-through mode, providing, by the mixer, the combined signal as a mixed signal, or (ii) while operating in a mixing mode, mixing, by the mixer, the combined signal with a mixer clock signal, to generate the mixed signal.

Example 21 includes the method of Example 20, wherein selectively switching by the switch comprises: providing the first DAC output signal as the combined signal responsive to a first switch clock signal having a high state; providing the second DAC output signal as the combined signal responsive to a second switch clock signal having a high state; and providing the reference voltage as the combined signal responsive to each of the first and second switch clock signals having a low state.

Example 22 includes the method of Example 21, wherein selectively switching by the switch comprises: receiving, by the switch and from the first DAC, the first DAC output signal that is representative of a first analog amplitude value generated by the first DAC responsive to processing a first sample of the digital amplitude signal; at least a threshold time period after starting to receive the first analog amplitude value, providing, by the switch, the first analog amplitude value as the combined signal; receiving, by the switch and from the second DAC, the second DAC output signal that is representative of a second analog amplitude value generated by the second DAC responsive to processing a second sample of the digital amplitude signal; and at least the threshold time period after starting to receive the second analog amplitude value, providing, by the switch, the second analog amplitude value as the combined signal.

In any of Examples 1 through 22, the mode of the mixer may be chosen or otherwise selected, for example, by a user, or a processor or controller, based on the frequency of the desired output, according to some further examples. If the desired output frequency is relatively low, the pass-through mode can be used; otherwise, the mixer mode can be used. For instance, in one such example, if the desired frequency of the output signal is less than one-third of a sampling clock (e.g., one-third of input clock signal of Example 2), then the pass-through mode can be used; otherwise, mixer mode can be used. In another such example, if the desired frequency of the output signal is less than one-half of the sampling clock, then the pass-through mode can be used; otherwise, mixer mode can be used.

Numerous specific details have been set forth herein to provide a thorough understanding of the examples. It will be understood, however, that other examples may be practiced without these specific details, or otherwise with a different set of details. It will be further appreciated that the specific structural and functional details disclosed herein are representative of examples and are not necessarily intended to limit the scope of the present disclosure. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims. Furthermore, examples described herein may include or otherwise be used in conjunction with other elements and components not specifically described, such as electrical connections, signal transmitters and receivers, and processors.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and examples have been described herein. The features, aspects, and examples are susceptible to combination with one another as well as to variation and modification, as will be appreciated in light of this disclosure. The present disclosure should, therefore, be considered to encompass such combinations, variations, and modifications. It is intended that the scope of the present disclosure be limited not by this detailed description, but rather by the claims appended hereto. Future filed applications claiming priority to this application may claim the disclosed subject matter in a different manner and may generally include any set of one or more elements as variously disclosed or otherwise demonstrated herein.

What is claimed is:

1. A direct digital synthesis (DDS) device comprising:
a first digital to analog converter (DAC) and a second DAC, wherein the first and second DACs are configured to respectively process first and second samples of an input signal;
a switch configured to receive a first DAC output signal from the first DAC and a second DAC output signal from the second DAC, and selectively switch among at least the first DAC output signal and the second DAC output signal to generate a combined signal; and
a multi-mode mixer configured to receive the combined signal and a mixer clock signal, and to operate in (i) a pass-through mode where the combined signal is provided as a mixed signal and (ii) a mixing mode where the combined signal is mixed with the mixer clock signal, to generate the mixed signal.

2. The DDS device of claim 1, comprising:
a clock circuit configured to receive an input clock signal, and generate a first switch clock signal and a second switch clock signal;
wherein the switch is configured to (i) provide the first DAC output signal as the combined signal responsive to the first switch clock signal having a high state, (ii) provide the second DAC output signal as the combined signal responsive to the second switch clock signal having a high state, and (iii) provide a substantially zero voltage as the combined signal responsive to each of the first and second switch clock signals having a low state.

3. The DDS device of claim 2, wherein the clock circuit is configured to:
generate the first switch clock signal, such that at least a threshold time period after the first DAC has started providing the first DAC output signal, (i) the first switch clock signal transitions to the high state and (ii) the switch allows the first DAC output signal to be provided as the combined signal; and
generate the second switch clock signal, such that at least the threshold time period after the second DAC has started providing the second DAC output signal, (i) the second switch clock signal transitions to the high state and (ii) the switch allows the second DAC output signal to be provided as the combined signal.

4. The DDS device of claim 3, wherein the first and second DAC output signals are first and second analog amplitude values, respectively.

5. The DDS device of claim 3, wherein the threshold time period is at least one-eighth of a clock cycle of the input clock signal.

6. The DDS device of claim 2, wherein the clock circuit is a first clock circuit, and the DDS device comprises a second clock circuit configured to receive the input clock signal and generate the mixer clock signal, and wherein the mixer clock signal is synchronized with the first switch clock signal and/or the second switch clock signal.

7. The DDS device of claim 6, wherein the mixer clock signal:
transitions to a low state when the first switch clock signal is at a low state;
remains at the low state when the first switch clock signal transitions to a high state;
remains at the low state when the first switch clock signal transitions back from the high state to the low state;
transitions to a high state when the second switch clock signal is at a low state;
remains at the high state when the second switch clock signal transitions to a high state; and
remains at the high state when the second switch clock signal transitions back from the high state to the low state.

8. The DDS device of claim 1, comprising a third DAC and a fourth DAC, wherein the third and fourth DACs are configured to respectively process third and fourth samples of the input signal, and wherein the switch is configured to receive a third DAC output signal from the third DAC and a fourth DAC output signal from the fourth DAC, and selectively switch among the first DAC output signal, the second DAC output signal, the third DAC output signal, and the fourth DAC output signal to generate the combined signal.

9. The DDS device of claim 8, wherein:
the clock circuit configured to generate a third switch clock signal and a fourth switch clock signal; and
the switch is configured to (iii) provide the third DAC output signal as the combined signal responsive to the third switch clock signal having a high state, (iv) provide the fourth DAC output signal as the combined signal responsive to the fourth switch clock signal having a high state, and (v) provide a substantially zero voltage as the combined signal responsive to each of the first, second, third, and fourth switch clock signals having a low state.

10. The DDS device of claim 1, comprising:
a phase accumulator configured to receive a frequency code word and an input clock signal, and provide a phase accumulation signal; and
a phase to amplitude converter configured to receive the phase accumulation signal, and convert the phase accumulation signal to generate the input signal.

11. The DDS device of claim 1, comprising a filter bank configured to process the mixed signal from the multi-mode mixer, the filter bank including one, two, or all three of:
a first bandpass filter configured to pass a frequency of the input signal;
a second bandpass filter configured to pass a sum of the frequency of the input signal and a frequency of the mixer clock signal;
a third bandpass filter configured to pass a difference in the frequency of the input signal and the frequency of the mixer clock signal.

12. An integrated circuit comprising DDS device of claim 1.

13. An apparatus comprising:
at least a first digital to analog converter (DAC) and a second DAC, wherein the first DAC is configured to process a first sample of a digital input signal and provide a first analog voltage, and the second DAC is configured to process a second sample of the digital input signal and provide a second analog voltage; and
a switch configured to (i) start receiving the first analog voltage from a first time, and start providing the first analog voltage as a combined signal at least after a threshold time delay from the first time, and (ii) start receiving the second analog voltage from a second time, and start providing the second analog voltage as a combined signal at least after a threshold time delay from the second time.

14. The apparatus of claim 13, wherein the switch is configured to provide a zero voltage as the combined signal, between providing the first analog voltage as the combined signal and providing the second analog voltage as the combined signal.

15. The apparatus of claim 13, comprising:
a first a clock circuit configured to receive an input clock signal, and generate a first DAC clock signal for the first DAC, and generate a second DAC clock signal for the second DAC; and
a second a clock circuit configured to receive the input clock signal, and generate a first switch clock signal and a second switch clock signal for the switch;
wherein the switch is configured to (i) provide the first analog voltage as the combined signal responsive to the first switch clock signal having a high state, (ii) provide the second analog voltage as the combined signal responsive to the second switch clock signal having a high state, and (iii) provide a substantially zero voltage as the combined signal responsive to each of the first and second switch clock signals having a low state.

16. The apparatus of claim 13, wherein the threshold time delay is at least one-quarter or one-eighth of a clock cycle of an input clock signal.

17. The apparatus of claim 13, comprising:
a signal mixer configured to receive the combined signal and a mixer clock signal, wherein the signal mixer is a multi-mode mixer configured to operate in either (i) a pass-through mode where the combined signal is provided as a mixed signal, or (ii) a mixing mode where the combined signal is mixed with the mixer clock signal, to generate the mixed signal.

18. The apparatus of claim 13, comprising:
a phase accumulator configured to receive a frequency code word and an input clock signal, and provide a phase accumulation signal; and
a phase to amplitude converter configured to receive the phase accumulation signal, and generate the digital signal.

19. A method comprising:
generating, by a phase to amplitude converter, a digital amplitude signal;
respectively processing, by a first digital to analog converter (DAC) and a second DAC, first and second samples of the digital amplitude signal, to generate a first DAC output signal by the first DAC and a second DAC output signal by the second DAC;
selectively switching, by a switch, among at least the first DAC output signal, the second DAC output signal, and a reference voltage, to generate a combined signal; and
processing, by a multi-mode mixer, the combined signal, to generate a mixed signal, wherein processing the combined signal comprises (i) while operating in a pass-through mode, providing, by the mixer, the combined signal as a mixed signal, or (ii) while operating in a mixing mode, mixing, by the mixer, the combined signal with a mixer clock signal, to generate the mixed signal.

20. The method of claim 19, wherein selectively switching by the switch comprises:
providing the first DAC output signal as the combined signal responsive to a first switch clock signal having a high state;
providing the second DAC output signal as the combined signal responsive to a second switch clock signal having a high state;
providing the reference voltage as the combined signal responsive to each of the first and second switch clock signals having a low state;
receiving, by the switch and from the first DAC, the first DAC output signal that is representative of a first analog amplitude value generated by the first DAC responsive to processing a first sample of the digital amplitude signal;
at least a threshold time period after starting to receive the first analog amplitude value, providing, by the switch, the first analog amplitude value as the combined signal;
receiving, by the switch and from the second DAC, the second DAC output signal that is representative of a second analog amplitude value generated by the second DAC responsive to processing a second sample of the digital amplitude signal; and
at least the threshold time period after starting to receive the second analog amplitude value, providing, by the switch, the second analog amplitude value as the combined signal.

* * * * *